(12) United States Patent
Feng et al.

(10) Patent No.: US 8,949,083 B2
(45) Date of Patent: Feb. 3, 2015

(54) MODELING GATE TRANSCONDUCTANCE IN A SUB-CIRCUIT TRANSISTOR MODEL

(75) Inventors: Jia Feng, San Jose, CA (US); Zhi-Yuan Wu, Union City, CA (US); Juhi Bansal, Sunnyvale, CA (US); Srinath Krishnan, Campbell, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 466 days.

(21) Appl. No.: 13/194,644

(22) Filed: Jul. 29, 2011

(65) Prior Publication Data

US 2013/0030774 A1 Jan. 31, 2013

(51) Int. Cl.
*G06F 17/50* (2006.01)

(52) U.S. Cl.
CPC .................................. *G06F 17/5036* (2013.01)
USPC .......... 703/2; 703/6; 703/14; 703/18; 330/253

(58) Field of Classification Search
USPC ................. 703/2, 14, 18, 6; 330/253
See application file for complete search history.

(56) References Cited

U.S. PATENT DOCUMENTS

| | | | | |
|---|---|---|---|---|
| 6,137,350 A | * | 10/2000 | Maeda | 327/563 |
| 6,314,390 B1 | * | 11/2001 | Bittner et al. | 703/14 |
| 6,426,676 B1 | * | 7/2002 | Kuijk | 330/252 |
| 6,744,320 B2 | * | 6/2004 | Nguyen et al. | 330/254 |
| 7,961,049 B2 | * | 6/2011 | Busking et al. | 330/296 |
| 8,183,922 B2 | * | 5/2012 | Fort et al. | 330/261 |
| 2001/0041548 A1 | * | 11/2001 | Bult et al. | 455/252.1 |
| 2002/0036328 A1 | * | 3/2002 | Richards et al. | 257/401 |
| 2003/0011429 A1 | * | 1/2003 | Kizaki | 330/253 |
| 2004/0189388 A1 | * | 9/2004 | Nguyen et al. | 330/254 |
| 2010/0010798 A1 | | 1/2010 | Wason et al. | |
| 2010/0066453 A1 | * | 3/2010 | Busking et al. | 330/296 |
| 2011/0304394 A1 | * | 12/2011 | Bult et al. | 330/253 |

\* cited by examiner

*Primary Examiner* — Thai Phan
(74) *Attorney, Agent, or Firm* — Amerson Law Firm, PLLC

(57) ABSTRACT

A method for modeling a transistor includes providing a transistor model having at least a source node, a drain node, and a gate node, simulating operation of a device using the transistor model in a computing apparatus, and generating an offset voltage at the gate node depending on a magnitude of a current passing through the device.

17 Claims, 4 Drawing Sheets

MODELING GATE TRANSCONDUCTANCE IN A SUB-CIRCUIT TRANSISTOR MODEL

CROSS-REFERENCE TO RELATED APPLICATIONS

Not applicable.

BACKGROUND

The disclosed subject matter relates generally to semiconductor devices and, more particularly, to the modeling of gate transconductance of a transistor device using a sub-circuit transistor model.

Compact models of metal-oxide-semiconductor field-effect transistors (MOSFETs) are widely used in simulations of integrated circuits. Conventional compact models, such as a Berkeley Short-Channel IGFET Model (BSIM) or a Berkeley Short-Channel IGFET Model for Silicon-on-insulator devices (BSIMSOI), have been primarily employed to model (or capture) transistor properties, such as drive current, $I_{DEFF}$, for digital circuits. To implement the transistor model, a reference transistor model is defined. The modeling system uses selected data (e.g., current-voltage (IV) operational characteristics) taken from an actual transistor and loads that data into a software modeling program. Parameters of the reference transistor model are then varied to attempt to match the modeled operational characteristics with the corresponding operational characteristics of the actual transistor.

Compact transistor models do not typically incorporate the breadth of parameters sufficient to accurately model transistor properties for analog circuits. One such analog parameter that is not accurately incorporated into the compact models is gate transconductance ($g_m$) in a low voltage regime (i.e., gate voltage close to the threshold voltage of the transistor). Furthermore, fabricated transistors are subject to process induced variations that cannot be controlled. For example, a series of actual transistors may have slightly different channel lengths, layer thicknesses, threshold voltages, etc., causing differences in actual operating characteristics from transistor to transistor. Consequently, it is useful to build these variations into the transistor model to allow the prediction of how the fabricated transistor will perform with these random variations. Simulations of advanced circuits require that the systemic and random variations in transistor properties be correctly modeled. Given the lack of parameters to accurately model $g_m$, it is very difficult to create a model that can simultaneously capture both variations in $g_m$ and variations in the digital properties (such as $I_{DEFF}$) simultaneously.

One approach to modeling $g_m$ involves using the parameters included in the compact models, such as carrier mobility, gate oxide thickness, and gate length, to model $g_m$ and variations in $g_m$. However, the digital properties (such as $I_{DEFF}$) of the transistor are usually sensitive to these parameters. Therefore, it is difficult to employ these parameters to model $g_m$ and variations in $g_m$ without sacrificing the accuracy of the modeling of the digital properties.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method for modeling a transistor. The method includes providing a transistor model having at least a source node, a drain node, and a gate node, simulating operation of a device using the transistor model in a computing apparatus, and generating an offset voltage at the gate node depending on a magnitude of a current passing through the device.

Another aspect of the disclosed subject matter is seen in a system including a storage device operable to store a transistor model having at least a source node, a drain node, and a gate node, and a computing apparatus operable to execute a simulation application to simulate operation of a device using the transistor model and generate an offset voltage at the gate node depending on a magnitude of a current passing through the device.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
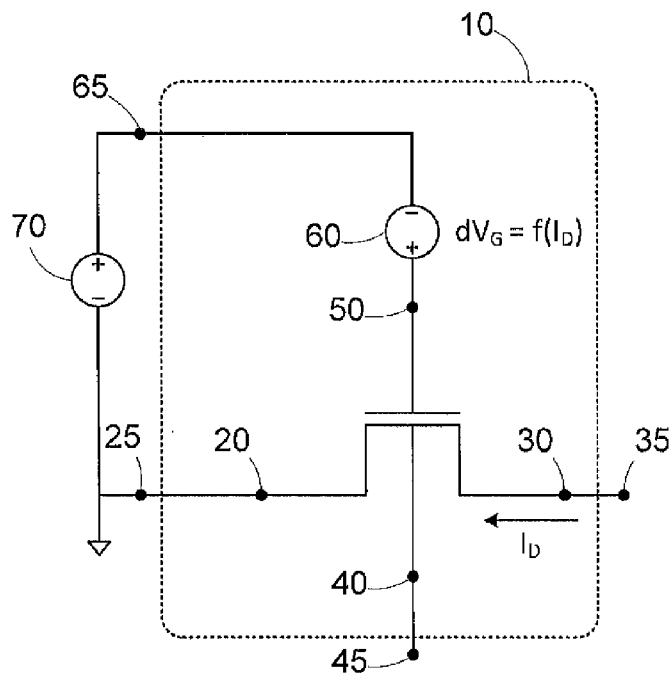
FIG. 1 is a diagram of a transistor model in accordance with one illustrative embodiment of the present subject matter, where gate transconductance is modeled as a function of drain current.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular farms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the disclosed subject matter shall be described in the context of a sub-circuit transistor model 10. The transistor model 10 defines a source node 20, a drain node 30, a body node 40, and a gate node 50. In some embodiments, the transistor may also define a substrate node (not shown). In the case of silicon-on-insulator (SOI) devices, the transistor model 10 may omit the body node 40. The modeling of gate transconductance is facilitated by a gate transconductance node 60 represented by a current controlled voltage source (CCVS) connecting the gate node 50 to an input voltage node 70 provided to the model 10. The various nodes 20, 30, 40, 60 connect to input/output ports 25, 35, 45, 65 of the transistor model 10.

The gate transconductance node 60 generates a gate voltage offset, $dV_G$, in addition to that provided by the input voltage node 70, $V_{GS}$. The gate transconductance offset voltage is modeled as a function of the drain current, $I_D$, in the form of a function $dV_G = f(I_D)$. The effective gate voltage provided to the gate node 50 is thus $V_{GS} + dV_G$. The gate transconductance seen external to the transistor model 10 is modeled by defining the function for the CCVS of the gate transconductance node 60. The specific function employed to generate the transconductance offset may be determined by measuring the gate transconductance of actual devices or by employing speculative gate transconductance targets.

Figure 2:
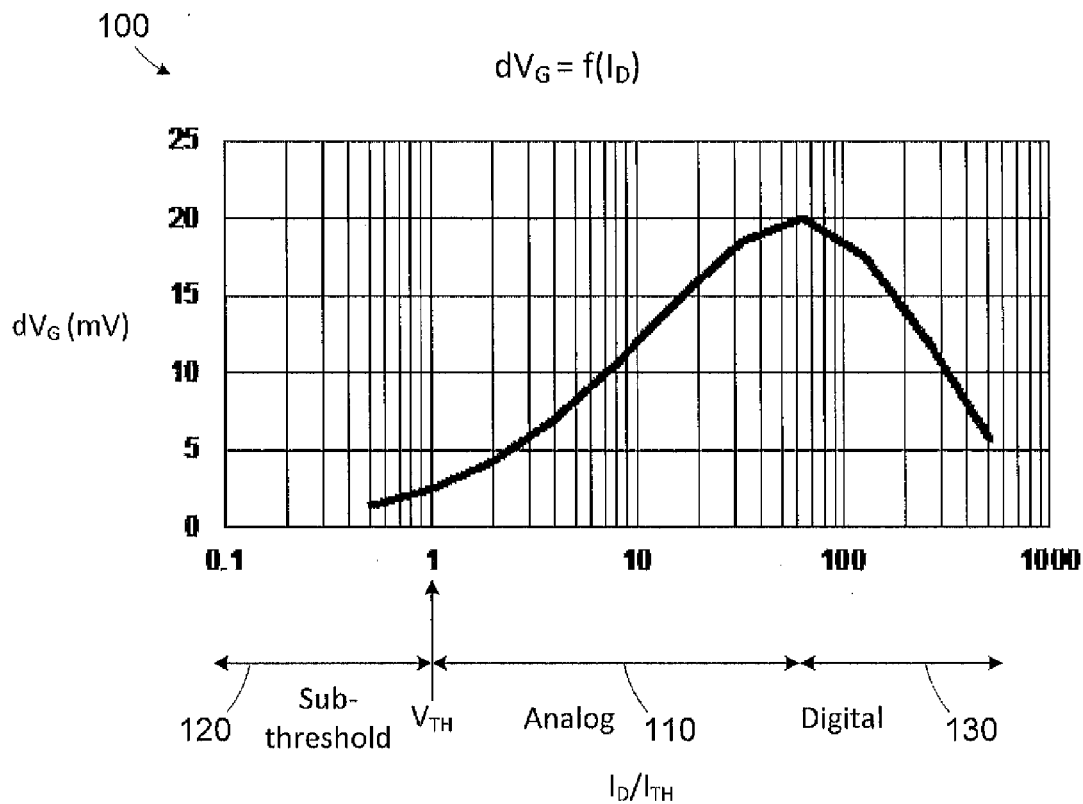
FIG. 2 is a diagram illustrating gate transconductance offset voltage as a function of normalized drain current.

In the illustrative embodiment, the gate transconductance function 100 is a bell-shaped function of drain current, as illustrated in FIG. 2. The drain current, $I_D$, is normalized by the threshold current, $I_{TH}$, seen when the threshold voltage, $V_{TH}$, is applied to the gate. In an analog operation region 110, the gate transconductance offset rises to a non-zero value. The gate transconductance offset decays to zero in a sub-threshold region 120 (i.e., where the gate voltage is below $V_{TH}$ and the drain current, $I_D$, is low). The gate transconductance offset also decays to zero in a digital operation region 130 (i.e., where the gate voltage is close to the nominal supply voltage and the drain current, $I_D$, is high). By modeling both the analog and digital operating regions 110, 120, the transistor model 10 models gate transconductance and variations thereof without sacrificing the accuracy of the digital property modeling.

An exemplary equation for modeling the gate transconductance offset generated by the gate transconductance node 60 is:

$$dV_G = f(I_D) = A \cdot \left(\frac{I_D}{N \cdot I_{TH}}\right) \cdot \exp\left(-B \cdot \left(\frac{I_D}{N \cdot I_{TH}}\right)^C\right),$$

where A, B, C, and N are model fitting parameters, and $I_{TH}$ is a threshold grain current that varies depending on the transistor technology. To model random variations in gate transconductance, perturbations in the values of the model fitting parameters from baseline values may be introduced. The particular perturbations may vary depending on the type of variation being modeled. In one example, for systemic variation in gate transconductance, the baseline value of the A parameter may be changed. In one embodiment, a positive voltage parameter (e.g., 1.02 V) may be used for A for a fast process corner, while a negative voltage parameter (e.g., −1.02 V) may be used for a slow process corner. For random variation, random values for A may be used.

Figure 3:
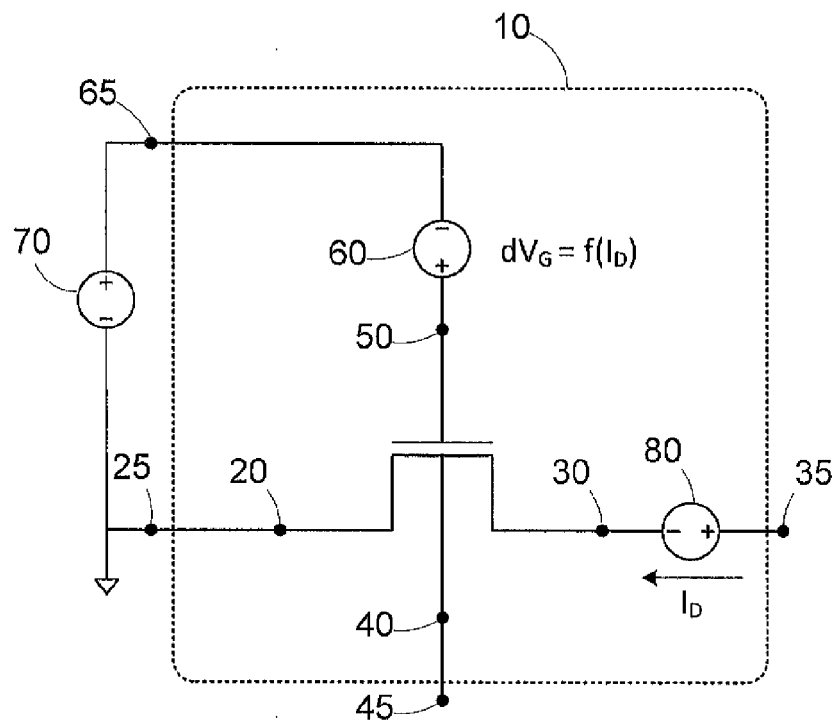
FIG. 3 is a diagram of a transistor model, where gate transconductance is modeled as a function of drain current using a dummy voltage source.

A variation of the embodiment of FIG. 2 is illustrated in FIG. 3, where a dummy voltage source 80 is connected between the drain node 30 and the input/output port 35 of the transistor model 10. The value of the drain current, $I_D$, may be read directly from the dummy voltage source 80 and provided to the gate transconductance node 60 for determination of the voltage offset.

Figure 4:
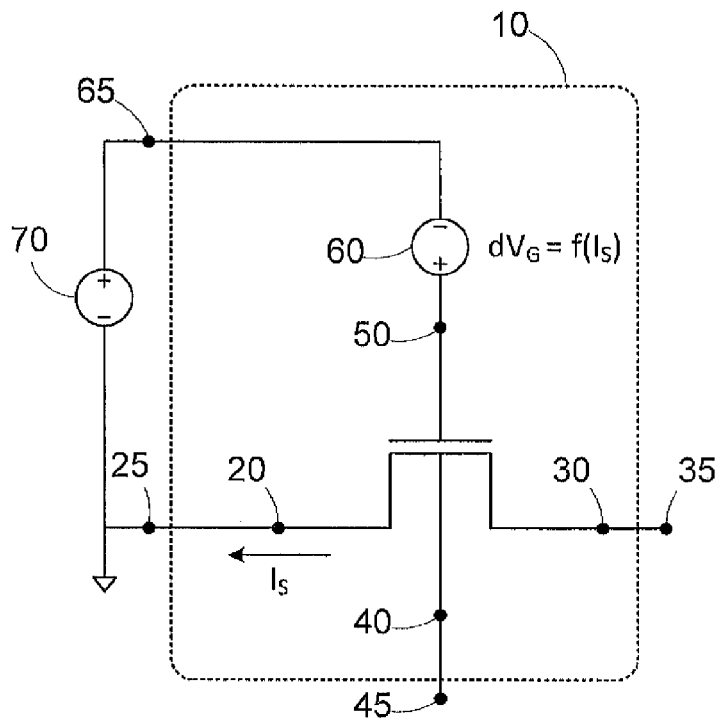
FIG. 4 is a diagram of a transistor model in accordance with an alternative embodiment of the present subject matter, where gate transconductance is modeled as a function of source current.

Another embodiment of the transistor model 10 is illustrated in FIG. 4. The gate transconductance node 60 is modeled as a function of source current, $I_S$, rather than drain current, so $dV_G = f(I_S)$. The transistor model 10 of FIG. 4 functions similar to that of FIG. 2, as the source and drain currents are approximately equal.

Figure 5:
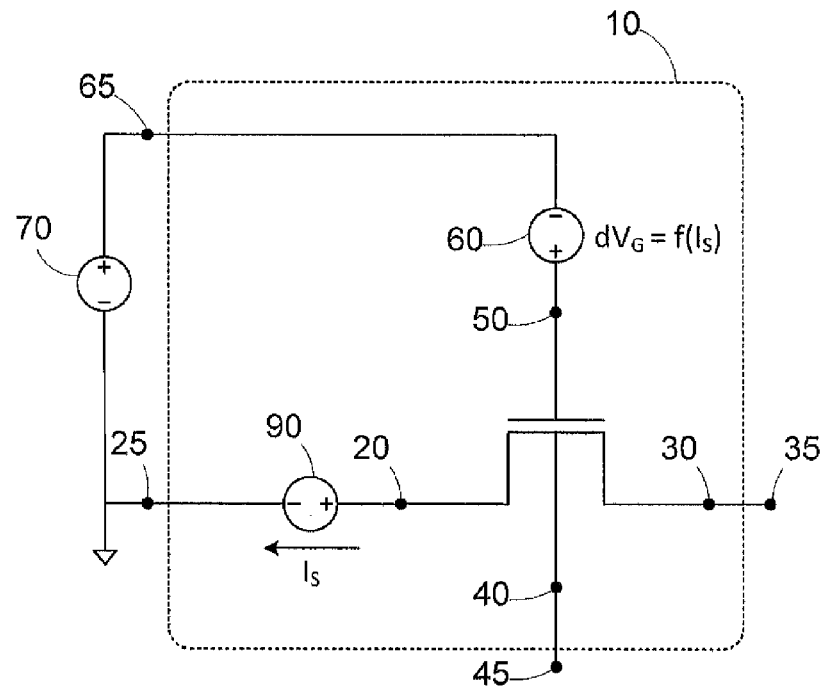
FIG. 5 is a diagram of a transistor model, where gate transconductance is modeled as a function of source current using a dummy voltage source.

A variation of the embodiment of FIG. 4 is illustrated in FIG. 5, where a dummy voltage source 90 is connected between the source node 20 and the input/output port 25 of the transistor model 10. The value of the source current, $I_S$, may be read directly from the dummy voltage source 90 and provided to the gate transconductance node 60 for determination of the voltage offset.

Figure 6:
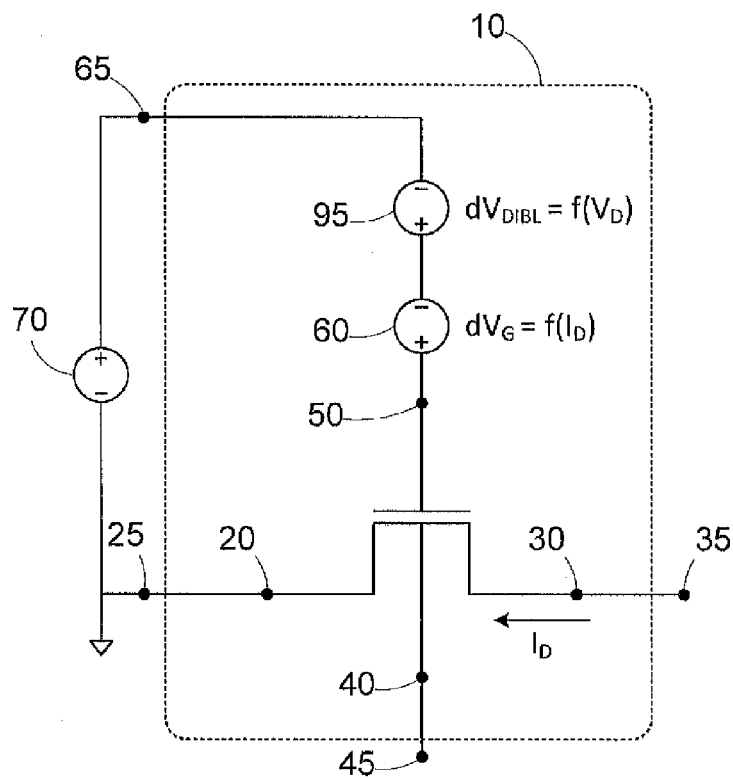
FIG. 6 is a diagram of a transistor model in accordance with yet another alternative embodiment of the present subject matter, where gate transconductance is modeled as a function of drain current and drain-induced barrier lowering is modeled as a function of drain voltage.

FIG. 6 illustrates an embodiment of the transistor model 10 incorporating the modeling of gate transconductance and drain-induced barrier lowering (DIBL), another parameter difficult to capture in a compact transistor model. DIBL is modeled using a voltage controlled voltage source 95 that provides an additional offset to the gate voltage as a function of the drain voltage, $V_D$. The DIBL offset is directly proportional to the drain voltage, $$V_{DIBL}=kV_D,$$

where the value of k may vary depending on the particular transistor being modeled. Random and systemic variation may be simulated by varying the magnitude and sign of k. The transistor model 10 of FIG. 6 allows concurrent modeling of both gate transconductance and DIBL in a compact transistor model. Although the model 10 of FIG. 6 is illustrated as being combined with the model of FIG. 1, any of the embodiments of the models 10 described herein may be used.

Figure 7:
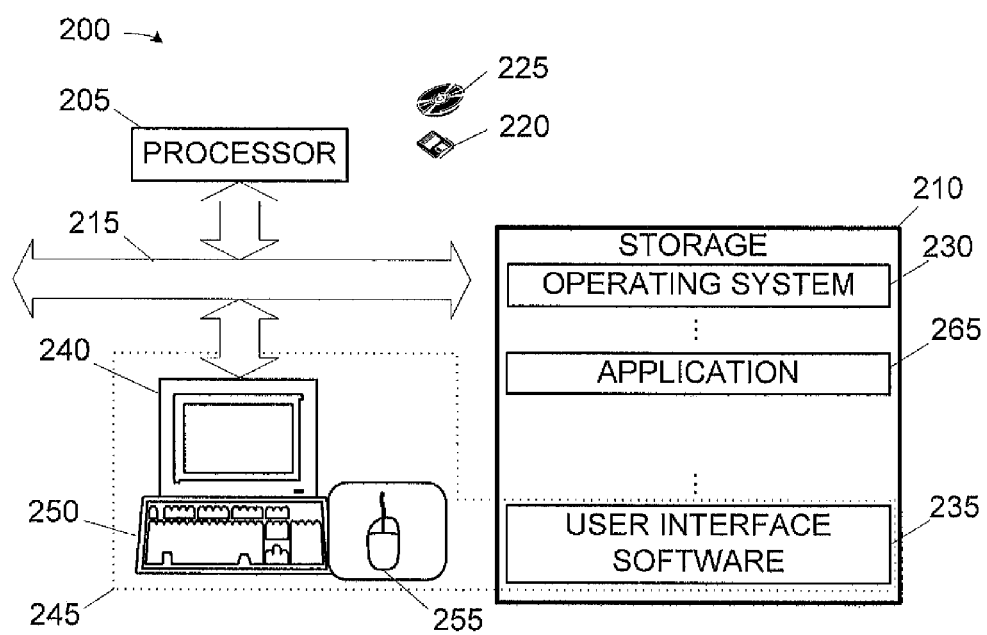
FIG. 7 is a simplified diagram of selected portions of the hardware and software architecture of a computing apparatus such as may be employed in some aspects of the present disclosure.

Turning now to FIG. 7, a simplified diagram of selected portions of the hardware and software architecture of a computing apparatus 200 such as may be employed in some aspects of the present subject matter. The computing apparatus 200 includes a processor 205 communicating with storage 210 over a bus system 215. The storage 210 may include a hard disk and/or random access memory ("RAM") and/or removable storage, such as a magnetic disk 220 or an optical disk 225. The storage 210 is also encoded with an operating system 230, user interface software 235, and a simulation application 265. The user interface software 235, in conjunction with a display 240, implements a user interface 245. The user interface 245 may include peripheral I/O devices such as a keypad or keyboard 250, mouse 255, etc. The processor 205 runs under the control of the operating system 230, which may be practically any operating system known in the art. The simulation application 265 is invoked by the operating system 230 upon power up, reset, user interaction, etc., depending on the implementation of the operating system 230. The simulation application 265, when invoked, performs a method of the present subject matter. The user may invoke the simulation application 265 in conventional fashion through the user interface 245. Note that although a stand-alone system is illustrated, there is no need for the data to reside on the same computing apparatus 200 as the simulation application 265 by which it is processed. Some embodiments of the present subject matter may therefore be implemented on a distributed computing system with distributed storage and/or processing capabilities.

It is contemplated that, in some embodiments, the simulation application 265 may be executed by the computing apparatus 200 to implement any of the transistor models 10 described herein, such as those illustrated in FIGS. 1 and 2-6, to model the performance of a transistor as well as any other devices encompassed by the simulation. Data for the simulation may be stored on a computer readable storage device (e.g., storage 210, disks 220, 225, solid state storage, and the like).

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method for modeling a transistor, comprising:
providing a transistor model for the transistor having at least a source node, a drain node, a gate node, and a gate transconductance node coupled to the gate node;
simulating operation of a device including the transistor using the transistor model in a computing apparatus; and
during the simulating, generating an offset voltage at the gate transconductance node depending on a magnitude of a current passing through the transistor, wherein generating the offset voltage further comprises applying an exponential function relating gate transconductance of the transistor to the current.

2. The method of claim 1, wherein the current comprises a current passing through the drain node.

3. The method of claim 1, wherein the current comprises a current passing through the source node.

4. The method of claim 1, wherein the exponential function comprises:
a sub-threshold region that decreases in magnitude as a function of decreasing values of the current for currents less than a threshold current of the device;
an analog region adjacent the sub-threshold region that increases in magnitude as a function of increasing values of the current; and
a digital region adjacent the analog region that decreases in magnitude as a function of increasing values of the current.

5. The method of claim 1, wherein the function comprises at least one model parameter, and the method further comprises varying the at least one parameter during the simulating.

6. The method of claim 5, wherein varying the at least one parameter comprises randomly varying the at least one parameter during the simulating.

7. The method of claim 1, wherein the transistor model comprises at least one dummy voltage source coupled to one of the drain node or the source node for determining the magnitude of the current.

8. The method of claim 1, further comprising generating a second offset voltage at the gate node depending on a magnitude of a voltage applied at the drain node.

9. A system, comprising:
a storage device operable to store a transistor model for a transistor having at least a source node, a drain node, a gate node, and a gate transconductance node coupled to the gate node;
a computing apparatus operable to execute a simulation application to simulate operation of a device including the transistor using the transistor model and generate an offset voltage at the gate transconductance node depending on a magnitude of a current passing through the device, wherein the simulation application is operable to generate the offset voltage by applying an exponential function relating gate transconductance of the transistor to the current.

10. The system of claim 9, wherein the current comprises a current passing through the drain node.

11. The system of claim 9, wherein the current comprises a current passing through the source node.

12. The system of claim 9, wherein the exponential function comprises:
a sub-threshold region that decreases in magnitude as a function of decreasing values of the current for currents less than a threshold current of the device;

an analog region adjacent the sub-threshold region that increases in magnitude as a function of increasing values of the current; and a digital region adjacent the analog region that decreases in magnitude as a function of increasing values of the current.

13. The system of claim 9, wherein the function comprises at least one model parameter, and the simulation application is operable to vary the at least one parameter during the simulating.

14. The system of claim 13, wherein the simulation application is operable to randomly vary the at least one parameter during the simulating.

15. The system of claim 9, wherein the transistor model comprises at least one dummy voltage source coupled to one of the drain node or the source node for determining the magnitude of the current.

16. The system of claim 9, wherein the simulation application is operable to generate a second offset voltage at the gate node depending on a magnitude of a voltage applied at the drain node.

17. A system for modeling a transistor, comprising:

means for storing a transistor model for the transistor having at least a source node, a drain node, a gate node, and a gate transconductance node coupled to the gate node;

means for simulating operation of a device including the transistor using the transistor model in a computing apparatus; and means for generating an offset voltage during the simulating at the gate transconductance node depending on a magnitude of a current passing through the transistor, wherein generating the offset voltage further comprises applying an exponential function relating gate transconductance of the transistor to the current.

\* \* \* \* \*